US00RE40230E

(19) United States
(12) Reissued Patent
Kneissi et al.

(10) Patent Number: US RE40,230 E
(45) Date of Reissued Patent: Apr. 8, 2008

(54) TWO SECTION BLUE LASER DIODE WITH REDUCED OUTPUT POWER DROOP

(75) Inventors: Michael Kneissi, Mountain View, CA (US); Thomas L. Paoli, Aptos, CA (US)

(73) Assignee: Palo Alto Research Center Incorporated, Palo Alto, CA (US)

(21) Appl. No.: 10/737,669

(22) Filed: Dec. 15, 2003

Related U.S. Patent Documents

Reissue of:
(64) Patent No.: 6,526,083
Issued: Feb. 25, 2003
Appl. No.: 09/972,361
Filed: Oct. 9, 2001

(51) Int. Cl.
*H01S 5/026* (2006.01)

(52) U.S. Cl. ..... 372/50; 438/48
(58) Field of Classification Search ..... 372/50; 438/48
See application file for complete search history.

(56) References Cited

U.S. PATENT DOCUMENTS 4,088,964 A * 5/1978 Clow ..... 372/19
4,563,765 A 1/1986 Tsang et al.
5,151,915 A 9/1992 Paoli
5,267,255 A 11/1993 Paoli
6,066,859 A 5/2000 Stegmueller
6,148,017 A 11/2000 Borchert et al.
6,437,372 B1 * 8/2002 Geva et al. ..... 257/94

FOREIGN PATENT DOCUMENTS

EP 0627798 12/1994
EP 1022825 7/2000

OTHER PUBLICATIONS

Jiang Hongtao et al.: "Linear electro–optic effect due to the built–in electric field in inGaN/GaN quantum wells" APPLIED PHYSICS LETTERS, AMERICAN INSTITUTE OF PHYSICS. NEW YORK US, vol. 75, No. 13, 27 Sep. 1999 (Sep. 27, 1999), pp. 1932–1934, XP012023617 ISSN:0003–695. Whole document.*

Kneissl, Michael, et al: "Two–Section InGaN Multiple–Quantum–Well Laser Diode With Integrated Electroabsorption Modulator" Applied Physics Letters, American Institute Of Physics, vol. 80, No. 18, May 6, 2002, pp. 3283–3285.

Jiang, Hongtao, et al. "Linear Electro–Optic effect due to the built–in electric field in InGaN/GaN Quantum Wells" Applied Physics Letters, American Institute of Physics, vol. 75, No. 13, Sep. 27, 1999, pp. 1932–1934.

* cited by examiner

*Primary Examiner*—M. Tran

(57) ABSTRACT

A III–V nitride blue laser diode has an amplifier region and a modulator region. The amplifier region has a constant current to keep the region near the lasing threshold. The modulator region has a small varying forward current or reverse bias voltage which controls the light output of the laser. This two section blue laser diode requires much lower power consumption than directly modulated lasers which reduces transient heating and "drooping" of the light output.

16 Claims, 8 Drawing Sheets

TWO SECTION BLUE LASER DIODE WITH REDUCED OUTPUT POWER DROOP

Matter enclosed in heavy brackets [ ] appears in the original patent but forms no part of this reissue specification; matter printed in italics indicates the additions made by reissue.

BACKGROUND OF THE INVENTION

The present invention relates to a blue laser diode and, more particularly, to a two section blue laser diode with an amplifier region and a modulator region to reduce power output variations.

Solid state lasers, also referred to as semiconductor lasers or laser diodes, are well known in the art. These devices generally consist of a planar multi-layered semiconductor structure having one or more active semiconductor layers bounded at their ends by cleaved surfaces that act as mirrors. The semiconductor layers on one side of the active layer in the structure are doped with impurities so as to have an excess of mobile electrons. The semiconductor layers on the other side of the active layer in the structure are doped with impurities so as to have a deficiency of mobile electrons, therefore creating an excess of positively charged carriers called holes. Layers with excess electrons are said to be n-type, i.e. negative, while layers with excess holes are said to be p-type, i.e. positive.

An electrical potential is applied through electrodes between the p-side and the n-side of the layered structure, thereby driving either holes or electrons or both in a direction perpendicular to the planar layers across the p-n junction so as to "inject" them into the active layers, where electrons recombine with holes to produce light. Optical feedback provided by the cleaved mirrors allows resonance of some of the emitted light to produce coherent "lasing" through the one mirrored edge of the semiconductor laser structure.

Semiconductor laser structures comprising group III–V nitride semiconductor layers grown on a sapphire substrate will emit light in the near ultra-violet to visible spectrum within a range including 360 nm to 650 nm.

The shorter wavelength of blue/violet laser diodes provides a smaller spot size and a better depth of focus than the longer wavelength of red and infrared (IR) laser diodes for laser printing operations and high density-optical storage. In addition, blue lasers can potentially be combined with existing red and green lasers to create projection displays and color film printers.

The III–V nitrides make possible diode lasers that operate at room temperature and emit shorter-wavelength visible light in the blue-violet range under continuous operation. The III–V nitrides comprise compounds formed from group III and V elements of the periodic table. The III–V nitrides can be binary compounds such as gallium nitride (GaN), aluminum nitride (AlN), or indium nitride (lnN), as well as ternary alloys of aluminum gallium nitride (AlGaN) or indium gallium nitride (InGaN), and quartemary alloys such as aluminum gallium indium nitride (AlGaInN).

These materials are highly promising for use in short-wavelength light emitting devices for several important reasons. Specifically, the AlGaInN system has a large band-gap covering the entire visible spectrum. III–V nitrides also provide the important advantage of having a strong chemical bond which makes these materials highly stable and resistant to degradation under high electric current and intense light illumination conditions that are present at active regions of the devices. These materials are also resistant to dislocation formation once grown.

High speed and high resolution printing requires laser devices with little or no fluctuations of the output power. For example, the variation in the laser light output required for red and IR laser diodes for printing applications is smaller than 4% and those requirements would be similar for AlGaInN laser diodes.

Heat is generated through voltages drops across the metal electrode/semiconductor interfaces, which have a finite resistance, and through voltage drops across the resistive semiconductor layers. Energy is also introduced into the active region of the laser by injecting electrons into the conduction band and/or holes into the valence band. Electrons relax into the lowest energy state of the conduction band and holes relax into the lowest energy state of the valence band through non-light emitting processes and release their energy in the form of heat.

When a laser device is switched from the OFF to the ON state, transient heating, or heating that changes over time, can cause the light output of AlGaInN laser diodes to drop significantly.

As an illustrative example, an AlGaInN blue laser diode is forward biased with a constant current above the lasing threshold current. At the initial time t=0, with a constant current of 65 mA, the blue laser diode will have a first output power PI of 9.5 mW with a laser structure temperature of 20 degrees C., as shown in FIG. 1.

However, as time increases with the blue laser diode above lasing threshold with the constant current, the temperature of the laser structure increases. This increased temperature results in a decreased output power for the AlGaInN laser diode.

At a subsequent time t=∞, still with a constant current of 65 mA, the blue laser will have a second output power P2 of 6.2 mW with a laser structure temperature of 30 degrees C., as shown in FIG. 1. The second output power P2 is lower than the initial output power P1. Thus, the plot of output power versus time of FIG. 2 shows an initial output power of P1 at turn-on, "drooping" to the second lower output power P2 as the blue laser diode is operated.

Thermal fluctuations are especially deleterious to maintaining constant optical power output, especially during pulsed modulation. In virtually all of the applications of these lasers, it is necessary to modulate the output of the laser into a series of pulses.

Transient heating during a sequence of pulses can have a cumulative effect on the temperature depending on the number and frequency of the pulses. For example, if the time between successive pulses is large, the laser diode will be given sufficient time to cool, so that the application of the driving current has a large temperature effect (i.e., a large droop in output power will occur at turn-on of the next pulse). The shorter the time between pulses, the less time the laser diode has to cool between one pulse and the next, leading to a sustained increase in the temperature of the laser. This sustained temperature increase results in a further decrease in the output pulse obtained with a constant level of input current.

Another related consequence of transient heating of a laser is wavelength variation during a pulse and over long streams of pulses. Essentially, the operating wavelength of a laser diode is dependent on the temperature of the laser diode. If the temperature varies, the wavelength of operation will vary. The effect of this variation of wavelength, for example in the laser xerography application, is to vary the energy that can be written onto the photoreceptor. This can also translate directly into variations in the spot size and pattern on the photoreceptor.

Digital printing requires accurate control of the optical energy delivered in each pulse. In systems currently known to those skilled in the art, a predetermined amount of energy is delivered in each pulse by turning on the optical beam to a desired power level for a fixed time interval. This approach requires that the laser output power be reproducible from pulse to pulse and constant during a pulse, in order that the optical energy delivered in each pulse be accurately controlled. Accurate control is especially important in printing with different grey levels formed by varying the number of exposed spots or when exposing very closely spaced spots in order to control the formation of an edge.

Due to the poor thermal conductivity of the sapphire substrate and the relatively high electric power consumption of III-nitride baser laser devices, transient heating is an issue to AlGaInN devices. For example, AlGaInN laser devices have threshold currents in the order of 50 mA and operating voltages of 5 V (compared to about 15 mA and 2.5 V for red lasers).

It is an object of the present invention to provide a blue laser with reduced power output variations due to transient heating.

SUMMARY OF THE INVENTION

According to the present invention, an III–V nitride blue laser diode has an amplifier region and a modulator region. The amplifier region has a constant current to keep the region near the lasing threshold. The modulator region has a small varying forward current or reverse bias voltage which controls the light output of the laser. This two section blue laser diode requires much lower power consumption than directly modulated lasers which reduces transient heating and "drooping" of the light output.

The light output of the laser diode is controlled by absorption changes in the modulator region. Absorption changes can be induced using field effects (e.g. QCSE) or carrier effects (e.g. band filling or field screening) which require much lower power consumption than directly modulated lasers.

Since only a small section of the laser diode is used to control the output power, the resulting lower capacitance should also be beneficial for achieving higher modulation speeds.

Other objects and attainments together with a fuller understanding of the invention will become apparent and appreciated by referring to the following description and claims taken in conjunction with the accompanying drawings.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DESCRIPTION OF THE INVENTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof.

Figure 1:
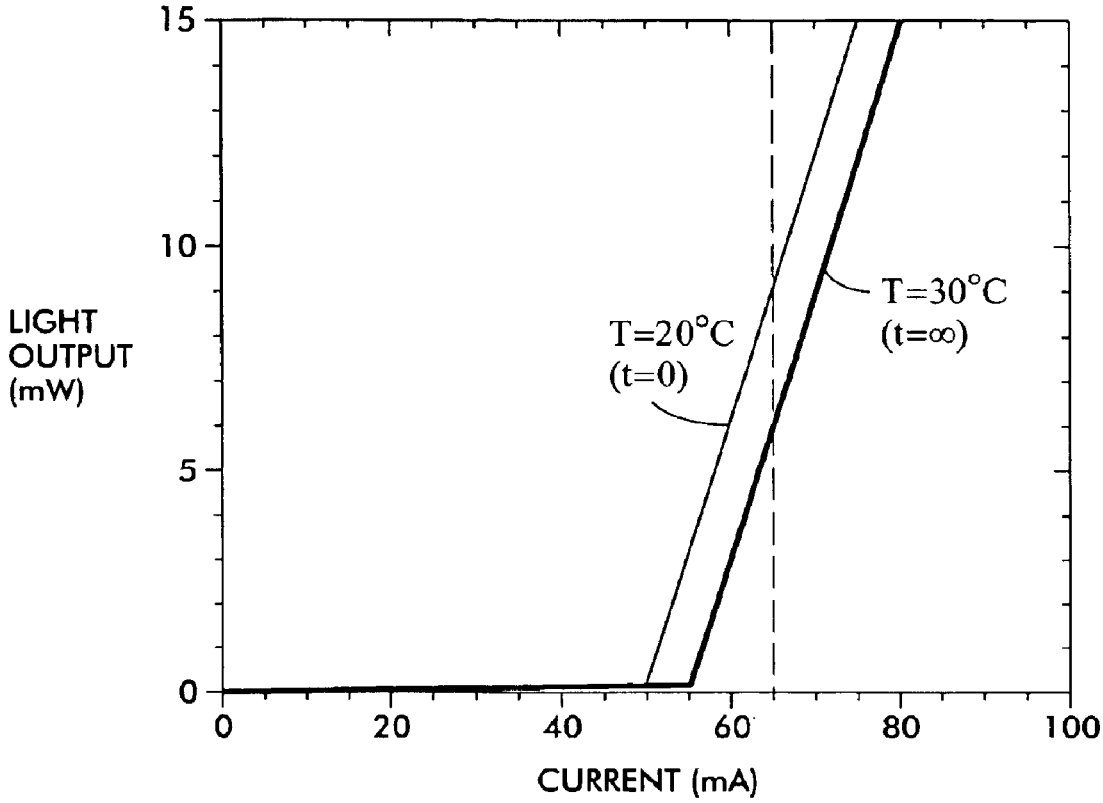
FIG. 1 is a plot of power output versus input current for a blue laser diode showing the effect of transient heating of the laser diode.
Figure 2:
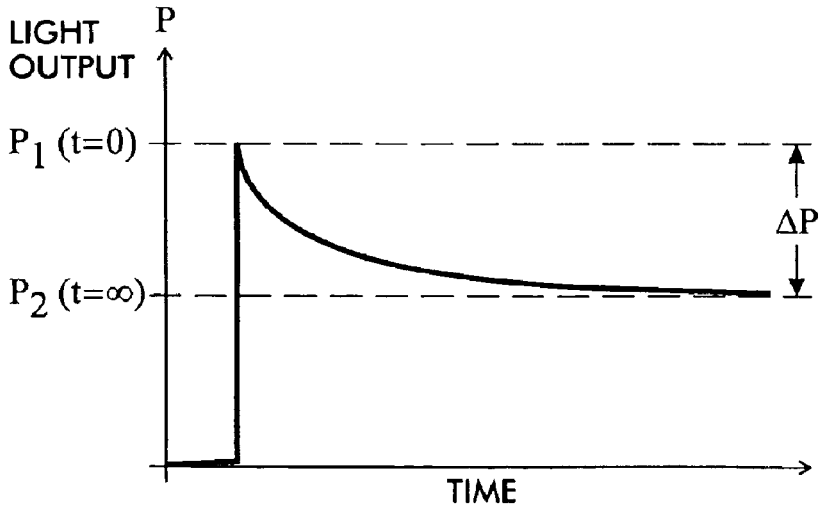
FIG. 2 is a plot of power output versus time for the blue laser diode of FIG. 1 showing power output "droop".
Figure 3:
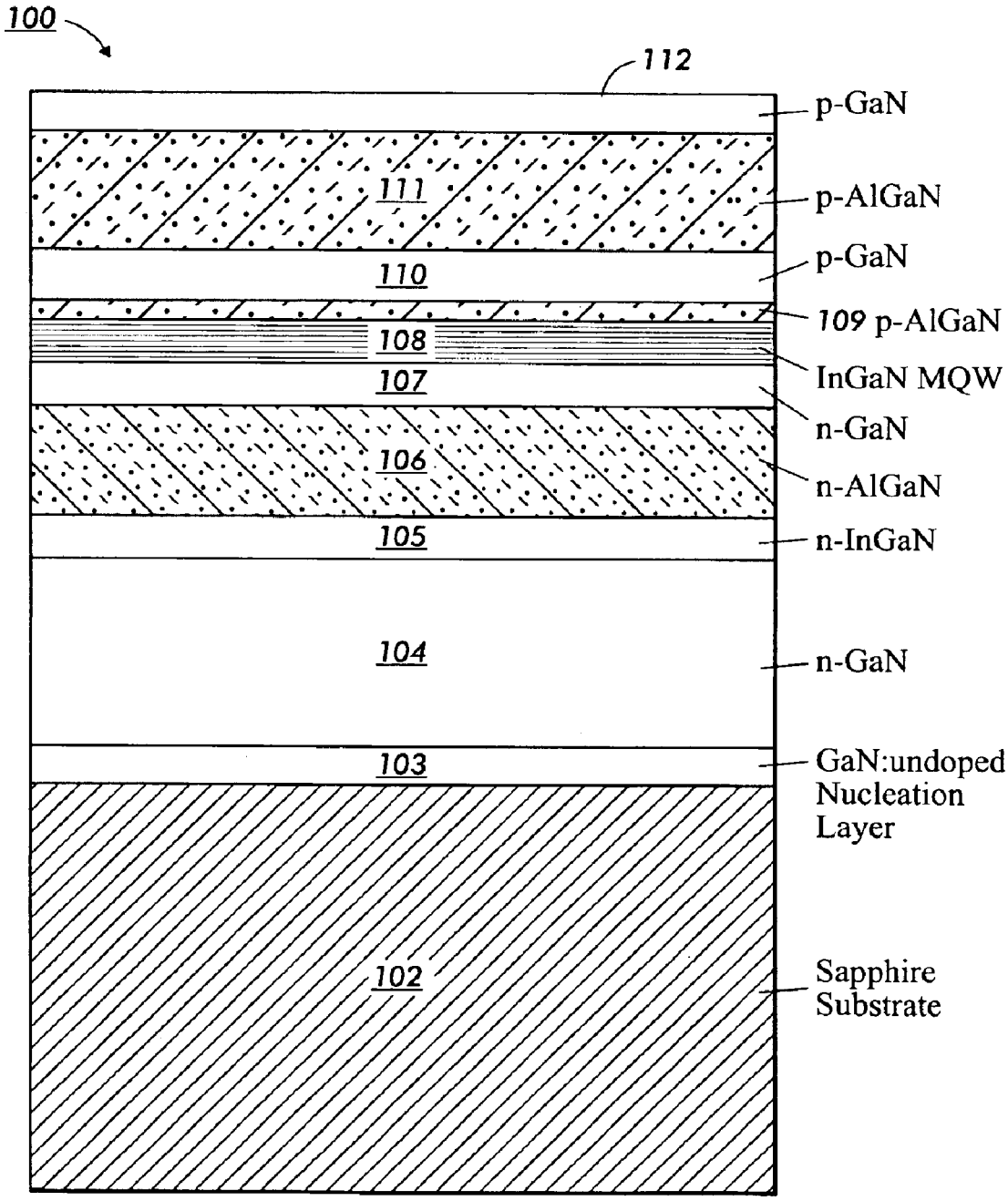
FIG. 3 is a cross-sectional side view of the blue laser diode of the present invention after III–V nitride film growth.

Reference is now made to FIG. 3 wherein is described the basic two section III–V nitride based semiconductor alloy diode laser 100 of the present invention. The semiconductor laser structure 100 has a C-face (0001) or A-face (1120) oriented sapphire ($Al_2O_3$) substrate 102 on which a succession of semiconductor layers is epitaxially deposited. The laser structure 100 includes a thin buffer layer 103, also known as a nucleation layer, formed on the sapphire substrate 102. The buffer layer 103 acts primarily as a wetting layer, to provide smooth, uniform coverage of the top surface of the sapphire substrate 102. The buffer layer 103 can comprise any suitable material. Typically, the buffer layer 103 is formed of a binary or ternary III–V nitride material, such as, for example, GaN, AlN, InGaN or AlGaN. The buffer layer 103 typically has a thickness of from about 10 nm to about 30 nm. The buffer layer 103 is typically undoped.

A second III–V nitride layer 104 is formed on the buffer layer 103. The second III–V nitride layer 104 is an n-type GaN or AlGaN layer. The second III–V nitride layer 104 acts as a lateral n-contact and current spreading layer. The second III–V nitride layer 104 typically has a thickness of from about 1 μm to about 10 μm. The second III–V nitride layer 104 is typically n-type GaN:Si or AlGaN:Si.

A third III–V nitride layer 105 is formed over the second III–V nitride layer 104. The third III–V nitride layer 105 is a defect reducing layer. The third III–V nitride layer 105 typically has a thickness of from about 25 nm to about 200 nm. The third III–V nitride layer 105 is typically n-type InGaN:Si with an In content smaller than the InGaN quantum well(s) in the active region 108.

A fourth III–V nitride layer 106 is formed over the third III–V nitride layer 105. The fourth III–V nitride layer 106 is an n-type cladding layer. The fourth III–V nitride layer 106 typically has a thickness of from about 0.2 μm to about 2 μm. The fourth III–V nitride layer 106 is typically n-type AlGaN:Si with an Al content larger than the third or the second III–V nitride layer.

A fifth III–V nitride layer 107, which is a waveguide layer, is formed over the fourth III–V nitride layer 106. The fifth III–V nitride layer 107 is typically n-type In GaN:Si, GaN:Si, InGaN:un or GaN:un with an In content smaller than the InGaN quantum well(s) in the active region 108. The overall thickness of the fifth III–V nitride layer 107 is typically from about 0.05 μm to about 0.2 μm.

On top of the fifth III–V nitride layer 107, the InGaN quantum well active region 108 is formed, comprised of at least one InGaN quantum well. For multiple-quantum well active regions, the individual quantum wells typically have a thickness of from about 10 Å to about 100 A and are separated by InGaN or GaN barrier layers which have typically a thickness of from about 10 Å to about 200 Å The InGaN quantum wells and the InGaN or GaN barrier layers are typically undoped or can be Si-doped.

A sixth III–V nitride layer 109, which is a carrier confinement layer, is formed over the InGaN (multiple) quantum well active region 108. The sixth III–V nitride layer 109 has a higher band gap than the quantum well active region. The sixth III–V nitride layer 109 is typically p-type $Al_xGa_{1-x}N$:Mg with an Al content in the range from x=0.05 to x=0.4. The overall thickness of the sixth III–V nitride layer 109 is typically from about 5 nm to about 100 nm.

A seventh III–V nitride layer 110, which is a waveguide layer, is formed over the sixth III–V nitride layer 109. The seventh III–V nitride layer 110 is typically p-type InGaN:Mg or GaN:Mg with an In content smaller than the InGaN multi-quantum well(s) in the active region. The overall thickness of the seventh III–V nitride layer 110 is typically from about 50 nm to about 200 nm.

A eighth III–V nitride layer 111 is formed over the seventh III–V nitride layer 110. The eighth III–V nitride layer 111 serves as a p-type cladding layer. The eighth III–V nitride layer 111 typically has a thickness of from about 0.2 μm to about 1 μm. The eighth III–V nitride layer 111 is typically AlGaN:Mg with an Al content larger than the seventh III–V nitride layer.

A ninth III–V nitride layer 112 is formed over the eighth III–V nitride layer 111. The ninth III–V nitride layer 112 forms a p-contact layer for the minimum-resistance metal electrode, to contact the p-side of the heterostructure 100. The ninth III–V nitride layer 112 typically has a thickness of from about 10 nm to 200 nm.

The laser structure 100 can be fabricated by a technique such as metalorganic chemical vapor deposition (MOCVD) or molecular beam epitaxy as is well known in the art. MOCVD growth is typically performed on 2-inch or 3-inch diameter sapphire substrate wafer. The substrate 102 can be a C-face (0001) or A-face (1120) oriented sapphire ($Al_2O_3$) substrate. The sapphire substrate wafers are of standard specifications including an epitaxial polish on one side and a typical thickness of 10-mil to 17-mil. Other examples of substrates include, but are not limited to 4H—SiC, 6H—SiC, AlN or GaN. In case of growth on a GaN substrate, the second III–V nitride layer 104 can be directly formed on top of the substrate 102 without the deposition of a nucleation layer 103. The substrate temperatures during growth are typically 550 degrees C. for the GaN nucleation layer, 1000 degrees C. to 1100 degrees C. for the GaN and AlGaN layers and 700 degrees C. to 800 degrees C. for the InGaN layers. In addition, the reactor pressure may be controlled between 50 Torr and 740 Torr. As organometallic precursors for the MOCVD growth TMGa (trimethylgallium), TMAl (trimethylalurninum), TMIn (trimethylindium) and TEGa (triethylgallium) are used for the group III elements and $NH_3$ (ammonia) is used as the nitrogen source. Hydrogen and/or nitrogen are used as carrier gas for the metalorganic sources. For the n-doping, 100 ppm $SiH_4$ diluted in $H_2$ is used, and for the p-doping, $Cp_2Mg$ (cyclopentadienylmagnesium) is used. Other examples of p-type dopants include, but are not limited to, Mg, Ca, C and Be. Examples of n-type dopants include, but are not limited to, Si, O, Se, Te and N-vacancies.

After MOCVD growth, the Mg p-doping in (Al)GaN:Mg layers is activated by RTA (rapid thermal annealing) at 850 degrees Celsius for 5 minutes in $N_2$ ambient. A ridge waveguide structure is formed by dry-etching into the p-GaN waveguide layer 110 with CAIBE (chemical assisted ion beam etching) or RIE (reactive ion beam etching) in an Ar(argon)/$Cl_2$(chlorine)/$BCl_3$(borontrichloride) gas mixture as shown in FIG. 4a.

Figure 4A:
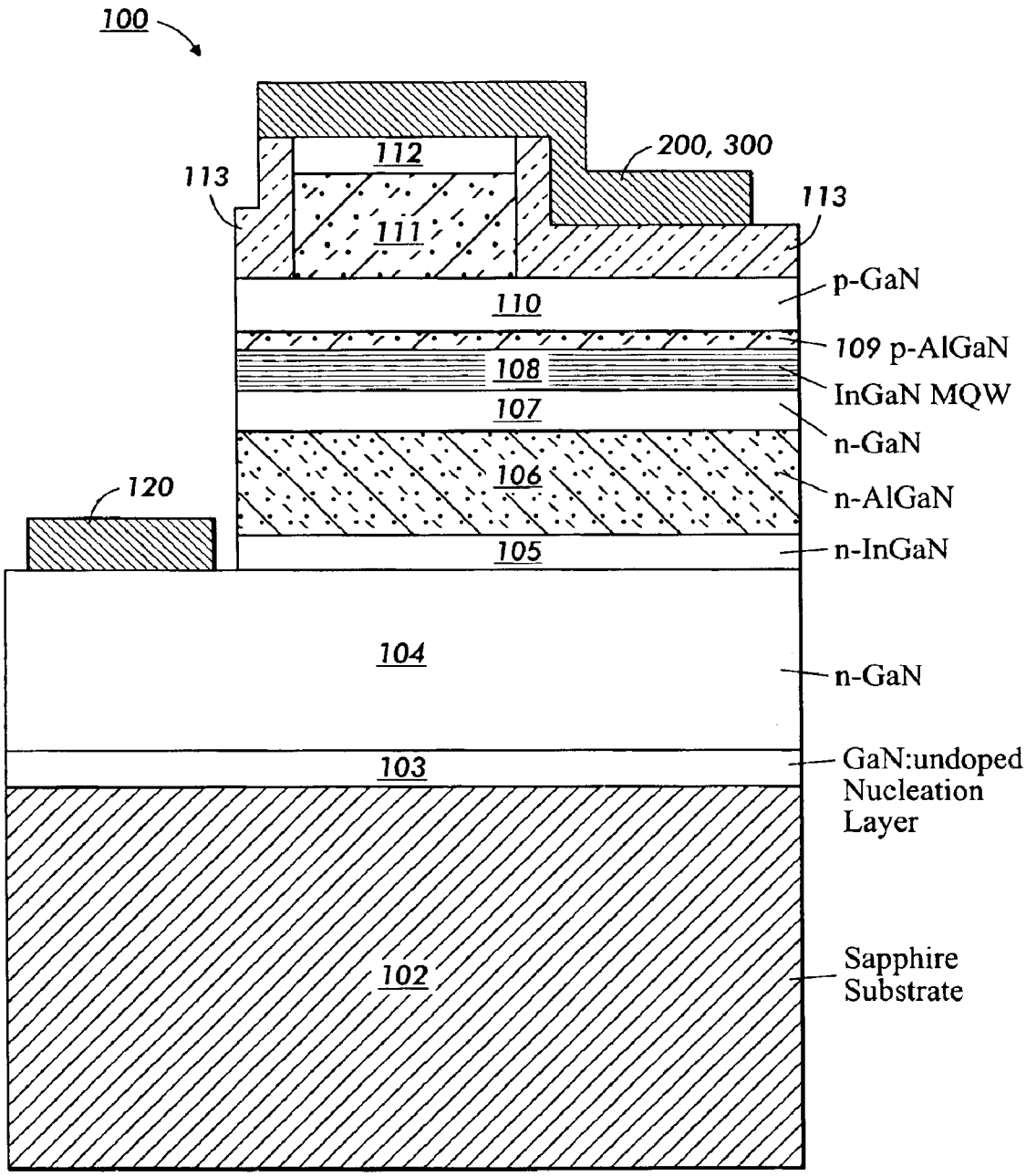
FIG. 4a is a cross-sectional front view of the two section ridge-waveguide blue laser diode with gain region and modulator region of the present invention.
Figure 4B:
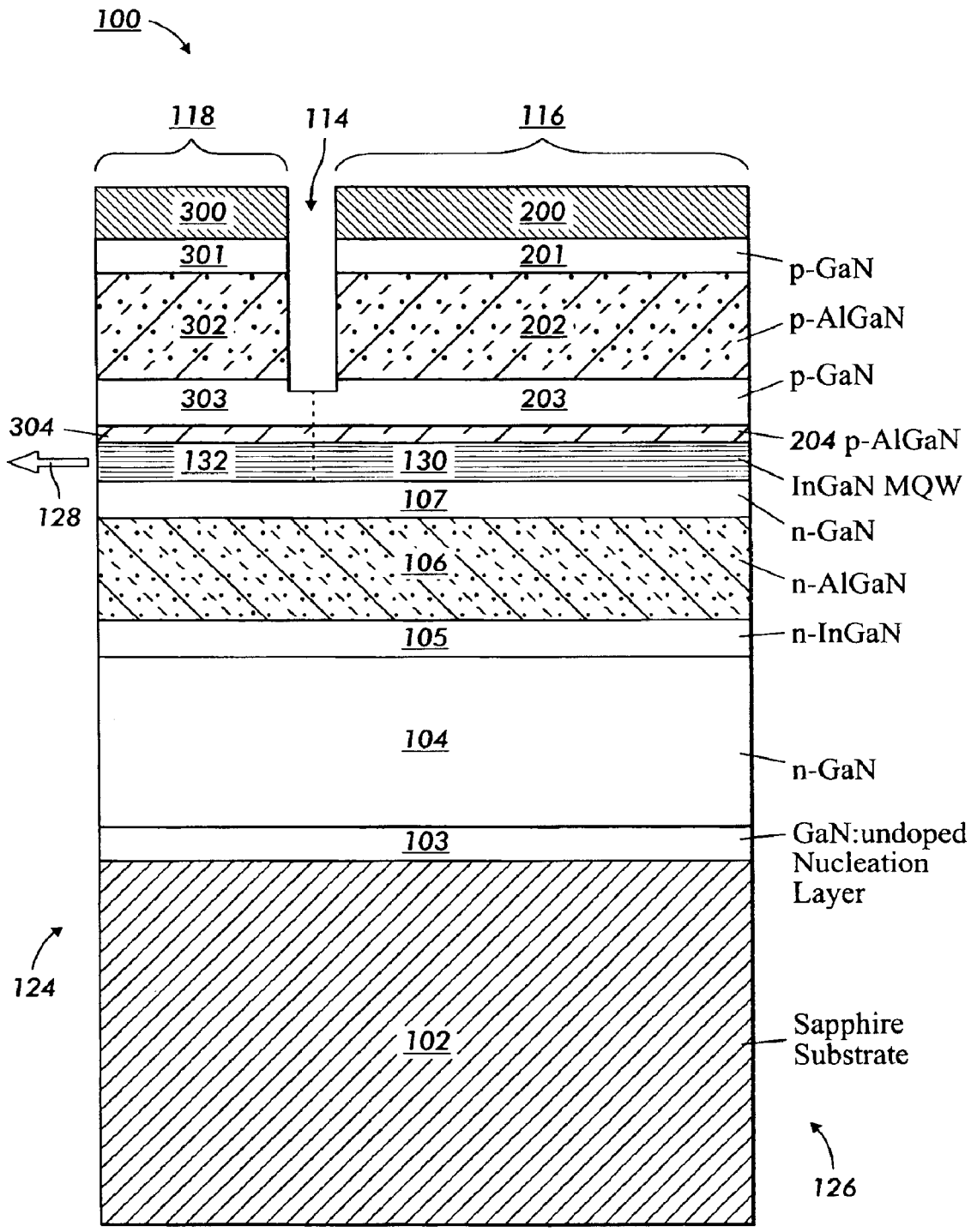
FIG. 4b is a cross-sectional side view of the two section blue laser diode with gain region and modulator region of the present invention separated by an etched trench.

In order to form the gain and the modulator section of the device, an isolation trench 114 is etched into the ridge-waveguide as shown in FIG. 4b. The isolation trench 114 can be formed in the same step as the ridge-wave-guide etch or can be formed in a separate step in order to obtain a different etch depth. An electrically insulating layer (e.g., silicon-oxy-nitride or $SiO_2$ or $Si_3N_4$) (not shown in the Figure) can be deposited, e.g. by plasma-enhanced chemical vapor deposition (PE-CVD), into the trench in order to reduce the disturbance of the optical mode and serve as passivation layer for the exposed surfaces.

Dry-etching using CAIBE (chemical assisted ion beam etching) or RIE (reactive ion beam etching) in an Ar/$Cl_2$/$BCl_3$ gas mixture is used to access the GaN:Si layer 104 for n-contact formation. An n-contact 120 is formed over the second III–V nitride layer 104, which is functioning as a lateral contact layer.

The n-electrode 120 of FIG. 4a is common to both the amplifier region 116 and the modulator region 118. The n-contact metal can be deposited by thermal evaporation, electron-beam evaporation or sputtering. Typically Ti/Al, Ti/Au or Ti/Al/Au are used as n-metal contacts. The n-contacts are annealed in $N_2$ ambient at 500 degrees Celsius in order to reduce the contact resistance. A dielectric isolation layer 113 (e.g. silicon-oxy-nitride or $SiO_2$ or $Si_3N_4$) is deposited by plasma-enhanced chemical vapor deposition (PE-CVD) on top of the ridge-waveguide. Alternatively polyimide can also used for isolation. Windows for p-contact formation are etched into the dielectric isolation layer using RF plasma etching in a $CF_4/O_2$ ambient.

In FIGS. 4a and 4b, a p-electrode 200 is deposited on top of the amplifier contact layer 201 for the amplifier region 116. A p-electrode 300 is deposited on top of the modulator contact layer 301 for the modulator region 118. The two p-electrodes 200 and 300 are separate and distinct and allow for independent addressability of the amplifier region 116 and the modulator region 118. Ni/Au, NiO/Au, Pd/Au, Pd/Au/Ti/Au, Pd/Ti/Au, Pd/Ni/Au, Pt/Au or Pd/Pt/Au can be deposited as p-contact metal by thermal evaporation, electron-beam evaporation or sputtering.

The laser facets can be formed either by cleaving or dry-etching (e.g. CAIBE). A $SiO_2/TiO_2$, $SiO_2/Ta_2O_5$ or $SiO_2/HfO_2$ high reflective coating can be deposited on the backside of laser diode facets 126 by e-beam evaporation in order to enhance the mirror reflectivity. A SiO or $SiO_2$ anti-reflective coating can be deposited on the front side of the laser diode facet 124 using e-beam evaporation.

Figure 5:
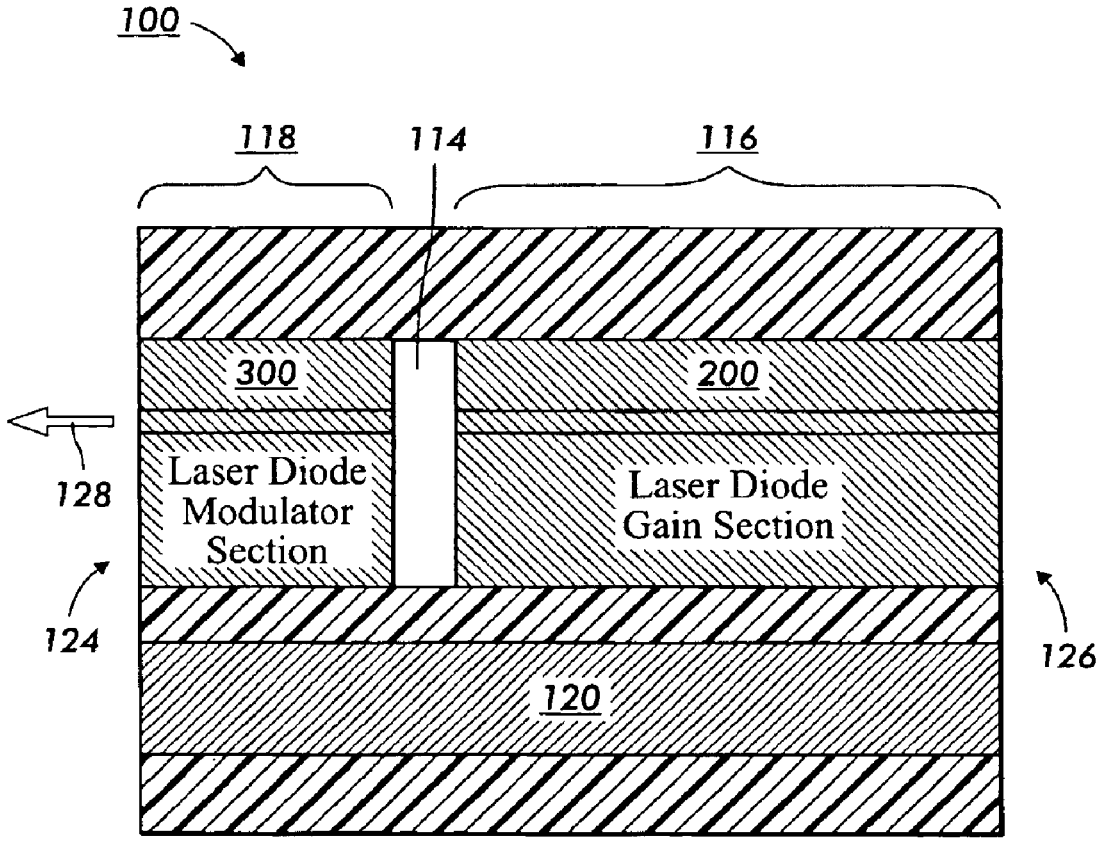
FIG. 5 is a top view of the two-section blue laser diode of FIG. 4.

As seen in FIGS. 4b and 5, the trench 114 separates the laser structure 100 into an amplifier region 116 and a modulator region 118. The amplifier region 116 has a metal p-contact 200, a p-contact layer 201, an upper cladding layer 202, an upper waveguide layer 203 and an upper confinement layer 204 The modulator region 118 has a metal p-contact 300, a p-contact layer 301, an upper cladding layer 302, an upper waveguide layer 303 and an upper confinement layer 304.

The amplifier p-contact layer 201 is separate and distinct from the modulator p-contact layer 301 but both are formed from the p-contact layer 112 before the groove 114 is etched. The amplifier upper cladding and waveguide layers 202 and 203 are separate and distinct from the modulator upper cladding and waveguide layers 302 and 303 but both are formed from the upper confinement and waveguide layer 110 and 111 before the groove 114 is etched. The amplifier upper confinement layer 204 is separate and distinct from the modulator upper confinement layer 304 but both are formed from the p-upper confinement layer 109 before the groove 114 is etched.

The active quantum well layer 108, the lower waveguide layer 107, the lower cladding layer 106, the defect reducing layer 105, the thick (Al)GaN current spreading layer 104, the buffer layer 103 and the substrate 102 are common to both the amplifier region 116 and the modulator region 118.

The optimum depth of the isolation trench 114 will depend on whether complete electric isolation is desired or minimum disturbance of the optical mode. Complete electric isolation is obtained if the trench 114 is etched through all the p-type layers and may even reach into or beyond the MQW active region 108. This might, however, disturb the optical mode traveling between the modulator and the gain section of the device and lead to scattering losses. If the trench is only partially etched into the p-type layers some electric connection between the gain and modulator section remains. The cross-talk between these two section, however, is expected to be quite small, because of the high lateral resistance of the p-type GaN and AlGaN layers. For example, if the trench 114 is only etched into the p-AlGaN cladding layer 111 (as shown in FIG. 4b), the remaining GaN:Mg waveguide layer 110 and p-AlGaN layer 109 would yield a series resistance of about 3 MΩ between the modulator and the gain section (assuming a waveguide thickness of 100 nm, a trench width of 10 μm and a ridge-waveguide width of 2 μm, a hole concentration of $10^{18}$ $cm^{-3}$ and a mobility of 1 $cm^2/Vs$). The trench can also be refilled with an electrically insulating dielectric layer (e.g. silicon-oxy-nitride or $Si_3N_4$) (not shown in the Figure), which can be deposited by plasma-enhanced chemical vapor deposition (PE-CVD)) in order to improve the optical coupling between the modulator and the gain section.

Figure 4C:
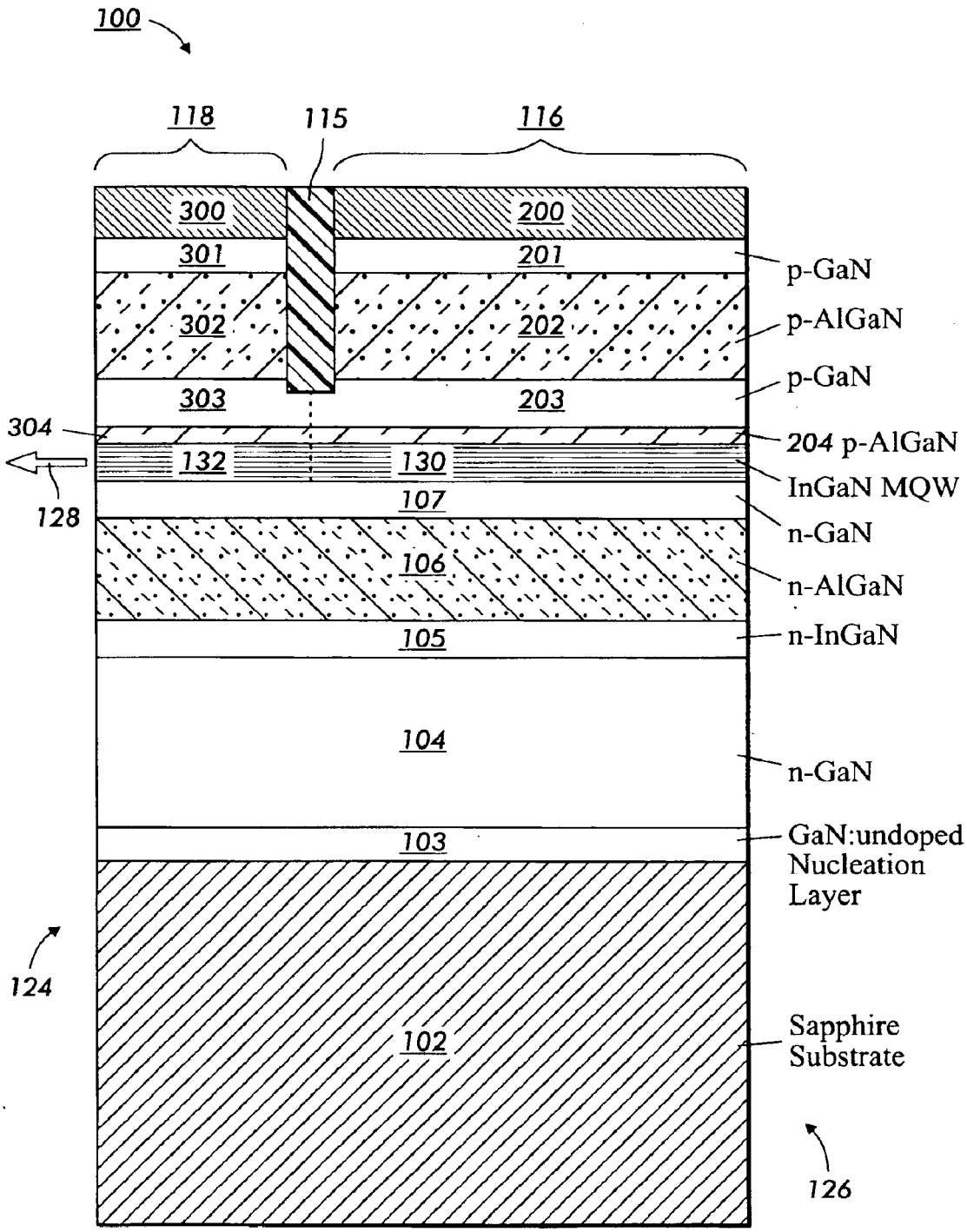
FIG. 4c is a cross-sectional side view of the two section blue laser diode with gain region and modulator region of the present invention separated by an electrically insulating ion implanted region.

Alternatively, electric isolation between the modulator and gain section can be obtained by ion implantation and without the etching of a trench. Ion implantation of the area 115 between the modulator and the gain section for example with protons ($H^+$) or oxygen ions would make this area electrically insulating and have the additional benefit that the optical waveguide would not be disturbed. An example of such a structure is shown in FIG. 4c. The ion implanted region could reach into or beyond the InGaN MQW active region in order to prevent and carriers from the gain section leaking into the modulator section of the device.

The light beam 128 emitted by the laser structure 100 is emitted from the mirror 124 adjacent to the modulator region 118 in order to minimize any spontaneous emission from the amplifier region 116 in the OFF state.

For this invention, the active layer 108 under the amplifier region 116 is the amplifier active layer 130 and the active layer 108 under the modulator region 118 is the modulator active layer 132.

In the two region blue laser structure 100, the amplifier region 116 is strongly pumped with current to serve as a light emitting region, and the modulator region 118 is pumped with a lower current level than the amplifier region to allow high frequency modulation. Alternatively the modulator region can be also reverse biased, which also enables high frequency operation.

The amplifier region 116 is of much greater length than the modulator region 118. Accordingly, the active layer 130 of the amplifier region 116 provides essentially all of the gain required to produce the desired output intensity. The active layer 132 of the modulator region 118 controls the output of laser 100 by switching the internal loss from a high value to a low value.

The amplifier region 116 will be forward biased by an input current applied through the p-electrode 200 and the n-electrode 120. The current will cause electrons to flow from the n-doped layers of the current spreading layer 104, the defect reducing layer 105, the lower cladding layer 106 and lower waveguide layer 107 into the amplifier active layer 130. The current also causes holes to flow from the p-doped layers of the amplifier contact layer 201, the amplifier upper cladding layer 202, the amplifier upper waveguide layer 203 and the amplifier upper current confinement layer 204 into the amplifier active layer 130. Recombination of the electrons and holes in the amplifier active layer 130 at a sufficient current will cause stimulated emission of light 128.

The current applied to the amplifier region 116 is adjusted so that enough gain is generated in the amplifier active layer 130 to overcome the total optical loss including the mirror loss and the optical loss from of the entire active layer 108 in the two section laser structure 100, when the modulator section 118 is in the ON state (ON state=the modulator active layer 132 is in the low-loss-state) but is not exceeding the total optical loss including the mirror loss and the loss of the entire active layer 108 if modulator region 118 is in the OFF state (OFF state=the modulator active layer 132 is in the high-loss-state). The amplifier current is kept constant. The two-section laser structure 100 modulates the laser emission and laser output power by varying the optical loss in the active layer 132 of the modulator section of the laser device. If the modulator section is its high-loss-state (OFF state), the gain produced in the amplifier section is not large enough to overcome the total optical loss and therefore lasing is prohibited. If the modulator is switched to its low-loss-state (ON state) the optical gain produced in the amplifier section will be large enough to overcome the total optical loss and lasing will be allowed. The optical loss in the modulator section can be either varied by applying a forward current or by applying a reverse bias voltage to the modulator region 118.

There are two basic modes of modulation for the two-section blue laser structure 100 of the present invention.

One mode, called the "forward current modulation mode", is one in which the amplifier region 116 is sufficiently forward biased to cause stimulated light emission and a negligible minimal forward bias current is applied to the modulator region. The modulator region 118 can be forward biased by an input current applied through the p-electrode 300 and the n-electrode 120. The current will cause electrons to flow from the n-doped layers of the current spreading layer 104, the defect reducing layer 105, the lower cladding layer 106 and lower waveguide layer 107 into the modulator active layer 132. The current also causes holes to flow from the p-doped layers of the modulator contact layer 301, the modulator upper cladding layer 302 and the modulator upper waveguide layer 303, and the modulator current confinement layer 304 into the modulator active layer 132. If no current is applied, the modulator section 118 is in the high-loss-state and lasing is prohibited (OFF state). Injection of the electrons and holes in the modulator active layer 132 at a sufficient current will reduce the loss in the modulator active layer 132. As the modulator region 118 is in its low-loss-state, the gain from the amplifier section 116 will be sufficiently high to overcome the total loss and lasing is permitted (ON State).

Another mode, called the "reverse bias modulation mode", also has the amplifier region sufficiently forward biased to cause stimulated emission, but has a reverse bias voltage applied to the modulator region.

The reverse bias input voltage to the modulator region 118 can be applied through the p-electrode 300 and the n-electrode 120. By applying a reverse bias to the modulator region p-n junction formed by the lower waveguide layer 107, the InGaN MQW active region 1132 and the upper current confinement layer 304, the electric field in the modulator section p-n junction can be changed. If no voltage is applied, the modulator section 118 is in the high-loss-state and lasing is prohibited (OFF state). As the modulator section 118 is in its low-loss-state, by applying an external reverse bias, the gain from the amplifier section 116 will be sufficiently high to overcome the total loss and lasing is permitted (ON state).

Figure 6A:
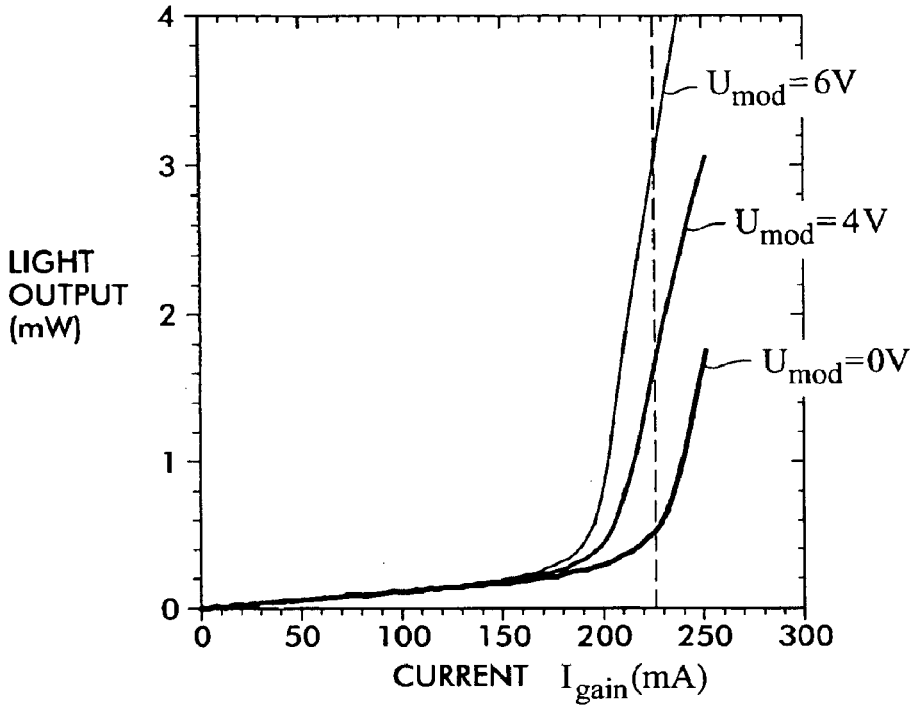
FIG. 6a shows the measured light output vis. current characteristic for a blue two-section laser diode for different modulator section reverse bias voltages.
Figure 6B:
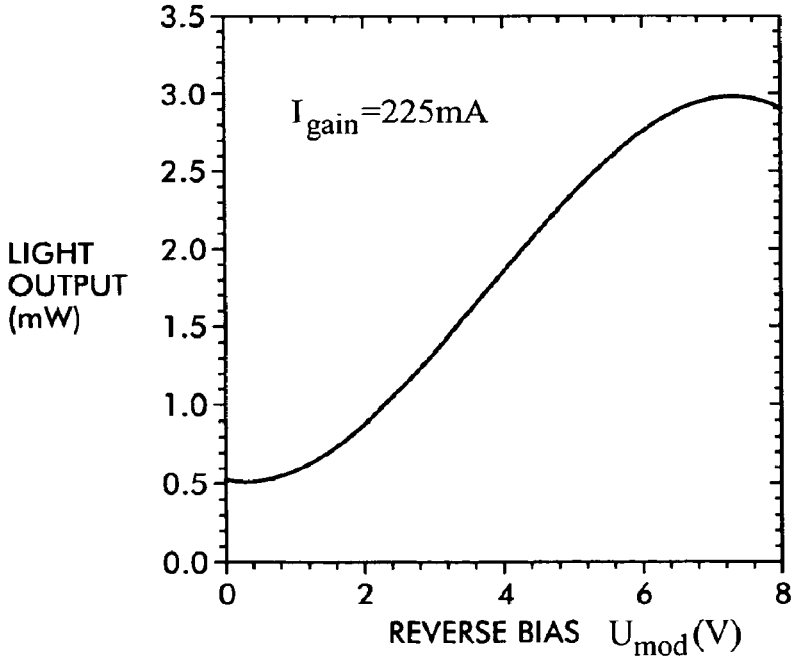
FIG. 6b shows the measured light output vs. reverse bias voltage characteristic for a blue two-section laser diode at a constant gain section current.
Figure 7A:
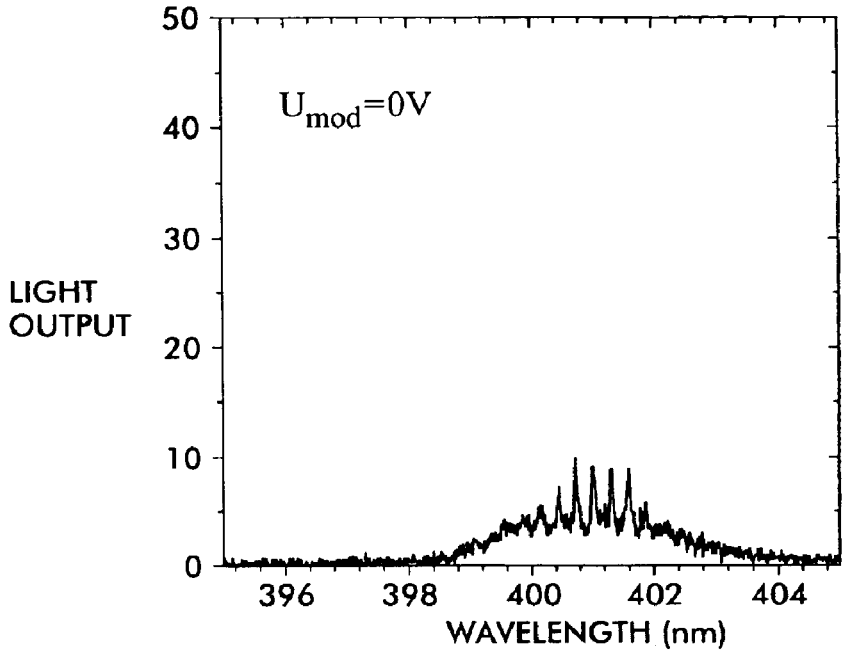
FIG. 7a shows the measured two-section laser diode emission spectra at a modulator section voltage of 0 V (OFF state).
Figure 7B:
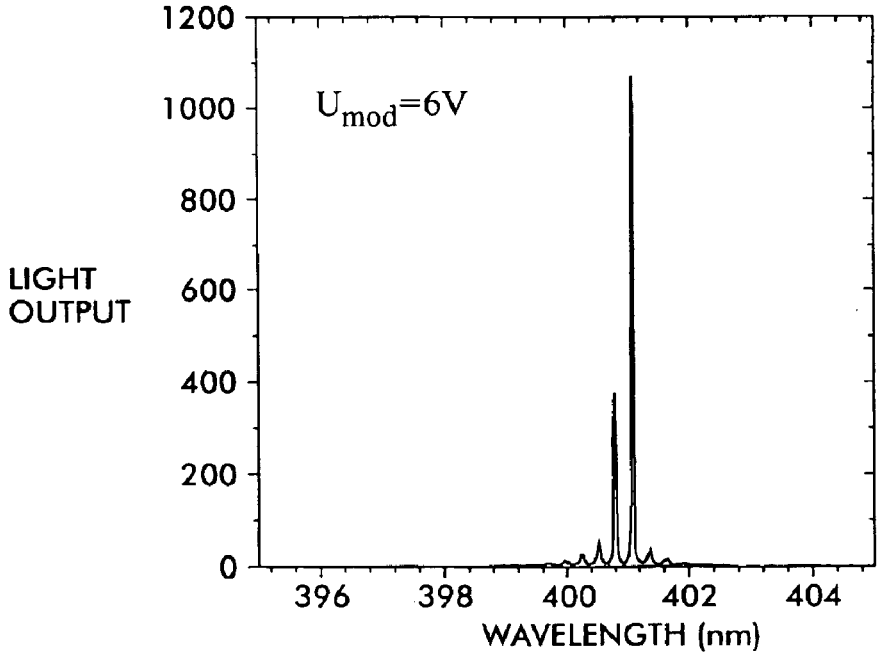
FIG. 7b shows the measured two-section laser diode emission spectra at a modulator section voltage of 6 V (ON state).

Examples of the measured laser diode characteristics of devices operating in the "reverse bias modulation mode" are shown in FIGS. 6 and 7. The amplifier region in this example has a length of 700 μm, the modulator region has a length of 100 μm and the ridge-waveguide has a width of 3 μm. Amplifier and modulator region are separated by a 20 μm wide trench, which was etched into the upper GaN waveguide layer 110. FIG. 6a shows the light output vs. current characteristic for such a two-section laser device with different reverse bias voltages applied to the modulator section. With no voltage applied to the modulator section, the loss in the modulator section is high resulting in a high threshold current ($I_{th}$~225 mA). If a reverse bias voltage is applied to the modulator section the loss in the modulator section is reduced leading to a reduction of the threshold current. For example at a modulator voltage of $U_{mod}$=6 V the threshold current is reduced to $I_{th}$~190 mA). In the "reverse bias modulation mode", the laser is operated with the current in the gain (amplifier) section set to a constant current of $I_{gain}$=225 mA (indicated by the dotted curve in FIG. 6a). The light output vs. modulator voltage characteristic of the same two-section laser diode is shown in FIG. 6b. The current in the gain (amplifier) section was set to a constant current value of $I_{gain}$=225 mA. As the reverse bias voltage applied to the modulator section increases, the loss in the modulator section is reduced and the light output increases from 0.5 mW (at zero bias) to ~3 mW (at $U_{mod}$=7.2 V). The corresponding laser diode emission spectra are shown in FIGS. 7a and 7b. At a modulator section voltage $U_{mod}$=0 V the loss in the modulator section is high, thus prohibiting lasing (as shown in FIG. 7a). If the modulator section reverse bias $U_{mod}$ is raised to 6 V, the loss the modulator section is reduced and consequently lasing is permitted, as can be seen in the spectra of FIG. 7b.

The varying modulator region current and the varying dissipated electric power in the modulator region is significantly smaller in comparison to the constant current and the dissipated electric power in the amplifier region. For example, if the two-section laser diode is operated in the "forward current modulation mode", the current density necessary to modulate the absorption in the modulator section (typically 100 A/cm$^2$ to (1000 A/cm$^2$) is only a fraction of the current density necessary to produce sufficient gain in the amplifier section (typically 2000 A/cm$^2$ to 5000 A/cm$^2$). Furthermore the length of the modulator section is much smaller (typically 1/10 to 1/5 of the length of the amplifier section) and therefore the current to switch the modulator section is even smaller. In the case when the two-section laser diode is operated in the "reverse bias modulation mode", the dissipated electric power in the modulator region will be even smaller. Since the modulator section is operated in reverse bias, no current is injected in the modulator section active region. The only current flowing in the modulator section is the photocurrent, which is induced by the absorbed light from the amplifier region. Accordingly, the laser structure 100 operates at an elevated but constant temperature due to the constant amplifier region current. The varying modulator region current will have minimal temperature effect to the laser structure 100. Modulating the laser from the non-light emitting, or OFF state, to the light emitting, or ON state, does -only result in a small increase in the operating temperature of the laser.

Since only the smaller modulator region 118 is used to control the output power of the emitted laser beam, the resulting lower capacitance will help achieve higher modulation speeds for the blue laser diode 100.

The laser diode structure according to the invention described above can be applied to any device requiring compact laser structures, including high resolution laser printing devices, digital printers, display devices, projection displays, high density optical storage devices, including magneto-optical storage devices, including CD-ROM and DVD's whereby data is stored on a magneto-optical disk, fiber-optic communications devices, including for fiber optic emitters and repeaters and undersea communications devices (sea water is most transparent in the blue-green spectrum). The LED structure according to the invention can also be applied to any device requiring compact LED structures, including illumination devices and full color displays, including monolithically integrated pixels for full color displays.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A semiconductor laser structure comprising:

a sapphire substrate;

a plurality of III–V nitride semiconductor layers formed on said sapphire substrate such that at least one of said plurality of III–V nitride semiconductor layers forms an active layer;

a first active region formed in said active layer, including at least one junction between p-type and n-type material, for functioning as an amplifier;

a second active region formed in said active layer, including at least one junction between p-type and n-type material, for functioning as an optical modulator;

wherein a sufficient forward bias is applied to said first active region such that stimulated emission is caused to occur therein, a portion of said stimulated emission being directed into said second active region, and the optical loss of said second active region is varied to cause lasing from said semiconductor laser structure.

2. The semiconductor laser structure of claim 1 wherein said optical loss of said second region of said semiconductor laser structure is varied by applying a forward bias current to said second active region.

3. The semiconductor laser structure of claim 1 wherein said optical loss of said second region of said semiconductor laser structure is varied by applying a reverse bias voltage to said second active region.

4. The semiconductor laser structure of claim 1 further comprising a trench formed in at least one of said plurality of III–V nitride semiconductor layers, said trench forming said first active region and said second active region.

5. The semiconductor laser structure of claim 2 further comprising a trench formed in at least one of said plurality of III–V nitride semiconductor layers, said trench forming said first active region and said second active region.

6. The semiconductor laser structure of claim 3 further comprising a trench formed in at least one of said plurality of III–V nitride semiconductor layers, said trench forming said first active region and said second active region.

7. The semiconductor laser structure of claim 4 wherein said trench is formed in said plurality of III–V nitride semiconductor layers to said active layer.

8. The semiconductor laser structure of claim 1 wherein said semiconductor laser structure emits light with a wavelength within a range including 360 nm to 650 nm.

*9. A semiconductor laser structure comprising:*

*a substrate;*

*a plurality of III–V nitride semiconductor layers formed on said substrate such that at least one of said plurality of III–V nitride semiconductor layers forms an active layer;*

*a first active region formed in said active layer, including at least one junction between p-type and n-type material, for functioning as an amplifier;*

*a second active region formed in said active layer, including at least one junction between p-type and n-type material, for functioning as an optical modulator;*

*wherein a sufficient forward bias is applied to said first active region such that stimulated emission is caused to occur therein, a portion of said stimulated emission being directed into said second active region, and the optical loss of said second active region is varied to cause lasing from said semiconductor structure.*

*10. The semiconductor laser structure of claim 9 wherein said optical loss of said second region of said semiconductor laser structure is varied by applying a forward bias current to said second active region.*

*11. The semiconductor laser structure of claim 9 wherein said optical loss of said second region of said semiconductor laser structure is varied by applying a reverse bias voltage to said second active region.*

*12. The semiconductor laser structure of claim 9 further comprising:*

*a trench formed in at least one of said plurality of III–V nitride semiconductor layers, said trench forming said first active region and said second active region.*

*13. The semiconductor laser structure of claim 10 further comprising:*

*a trench formed in at least one of said plurality of III–V nitride semiconductor layers, said trench forming said first active region and said second active region.*

*14. The semiconductor laser structure of claim 11 further comprising*

*a trench formed in at least one of said plurality of III–V nitride semiconductor layers, said trench forming said first active region and said second active region.*

*15. The semiconductor laser structure of claim 12 wherein said trench is formed in said plurality of III–V nitride semiconductor layers to said active layer.*

*16. The semiconductor laser structure of claim 9 wherein said semiconductor laser structure emits light with a wavelength within a range including 360 nm to 650 nm.*

* * * * *

UNITED STATES PATENT AND TRADEMARK OFFICE

CERTIFICATE OF CORRECTION

PATENT NO. : RE 40,230 E
APPLICATION NO. : 10/737669
DATED : April 8, 2008
INVENTOR(S) : Michael A. Kneissl et al.

It is certified that error appears in the above-identified patent and that said Letters Patent is hereby corrected as shown below:

Cover Page, after "(73) Assignee":

replace Palo Alto Research Center Incorporated, Palo Alto, CA (US)

with: Xerox Corporation, Norwalk, CT (US)

Signed and Sealed this

Twenty-fourth Day of March, 2009

JOHN DOLL
*Acting Director of the United States Patent and Trademark Office*